United States Patent
Moore et al.

(10) Patent No.: US 7,163,837 B2
(45) Date of Patent: Jan. 16, 2007

(54) METHOD OF FORMING A RESISTANCE VARIABLE MEMORY ELEMENT

(75) Inventors: John T. Moore, Boise, ID (US); Kristy A. Campbell, Boise, ID (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 289 days.

(21) Appl. No.: 10/230,189

(22) Filed: Aug. 29, 2002

(65) Prior Publication Data

US 2004/0042265 A1 Mar. 4, 2004

(51) Int. Cl.
*H01L 21/06* (2006.01)

(52) U.S. Cl. .................. 438/102; 257/E21.07

(58) Field of Classification Search ............ 438/102, 438/103, 95, 93; 257/E21.07
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,671,618 A | 6/1987 | Wu et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |

(Continued)

FOREIGN PATENT DOCUMENTS

JP 56126916 10/1981

(Continued)

OTHER PUBLICATIONS

Abdel-All, A.; Elshafie,A.; Elhawary, M.M., DC electric-field effect in bulk and thin-film Ge5As38Te57 chalcogenide glass, Vacuum 59 (2000) 845-853.

(Continued)

*Primary Examiner*—Bradley K. Smith
(74) *Attorney, Agent, or Firm*—Dickstein Shapiro LLP

(57) ABSTRACT

A method for controlling silver doping of a chalcogenide glass in a resistance variable memory element is disclosed herein. The method includes forming a silver layer over a chalcogenide glass layer. Processing the silver layer via heat treating, light irradiation, or a combination of both to form a layer comprising silver interstitially formed in a chalcogenide glass layer; silver-selenide formed in a layer comprising silver interstitially formed in a chalcogenide glass layer; or a silver doped chalcogenide glass layer having silver-selenide formed therein.

51 Claims, 13 Drawing Sheets

U.S. PATENT DOCUMENTS

| | | |
|---|---|---|
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B1 | 5/2002 | Kozicki et al. |
| 6,391,688 B1 | 5/2002 | Gonzalez et al. |
| 6,404,665 B1 | 6/2002 | Lowrey et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowrey |
| 6,507,061 B1 | 1/2003 | Hudgens et al. |
| 6,511,862 B1 | 1/2003 | Hudgens et al. |
| 6,511,867 B1 | 1/2003 | Lowrey et al. |
| 6,512,241 B1 | 1/2003 | Lai |
| 6,514,805 B1 | 2/2003 | Xu et al. |
| 6,531,373 B1 | 3/2003 | Gill et al. |
| 6,534,781 B1 | 3/2003 | Dennison |
| 6,545,287 B1 | 4/2003 | Chiang |
| 6,545,907 B1 | 4/2003 | Lowrey et al. |
| 6,555,860 B1 | 4/2003 | Lowrey et al. |
| 6,563,164 B1 | 5/2003 | Lowrey et al. |
| 6,566,700 B1 | 5/2003 | Xu |
| 6,567,293 B1 | 5/2003 | Lowrey et al. |
| 6,569,705 B1 | 5/2003 | Chiang et al. |
| 6,570,784 B1 | 5/2003 | Lowrey |
| 6,576,921 B1 | 6/2003 | Lowrey |
| 6,586,761 B1 | 7/2003 | Lowrey |
| 6,589,714 B1 | 7/2003 | Maimon et al. |
| 6,590,807 B1 | 7/2003 | Lowery |
| 6,593,176 B1 | 7/2003 | Dennison |
| 6,597,009 B1 | 7/2003 | Wicker |
| 6,605,527 B1 | 8/2003 | Dennison et al. |
| 6,613,604 B1 | 9/2003 | Maimon et al. |
| 6,621,095 B1 | 9/2003 | Chiang et al. |
| 6,625,054 B1 | 9/2003 | Lowery et al. |
| 6,642,102 B1 | 11/2003 | Xu |
| 6,646,297 B1 | 11/2003 | Dennison |
| 6,649,928 B1 | 11/2003 | Dennison |
| 6,667,900 B1 | 12/2003 | Lowrey et al. |
| 6,671,710 B1 | 12/2003 | Ovshinsky et al. |
| 6,673,648 B1 | 1/2004 | Lowrey |
| 6,673,700 B1 | 1/2004 | Dennison et al. |
| 6,674,115 B1 | 1/2004 | Hudgens et al. |
| 6,687,153 B1 | 2/2004 | Lowrey |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowrey |
| 6,714,954 B1 | 3/2004 | Ovshinsky et al. |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |

| | | | |
|---|---|---|---|
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krleger et al. | |
| 2002/0168820 A1 | 11/2002 | Kozicki | |
| 2002/0168852 A1 | 11/2002 | Harshfield et al. | |
| 2002/0190289 A1 | 12/2002 | Harshfield et al. | |
| 2002/0190350 A1 | 12/2002 | Kozicki et al. | |
| 2003/0001229 A1 | 1/2003 | Moore et al. | |
| 2003/0022518 A1* | 1/2003 | Munakata et al. | 438/745 |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0048744 A1 | 3/2003 | Ovshinsky et al. | |
| 2003/0049912 A1 | 3/2003 | Campbell et al. | |
| 2003/0068861 A1 | 4/2003 | Li | |
| 2003/0068862 A1 | 4/2003 | Li | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1* | 8/2003 | Campbell et al. | 257/225 |
| 2003/0155606 A1 | 8/2003 | Campbell et al. | |
| 2003/0156447 A1 | 8/2003 | Kozicki | |
| 2003/0156463 A1 | 8/2003 | Casper et al. | |
| 2003/0209728 A1 | 11/2003 | Kozicki et al. | |
| 2003/0209971 A1 | 11/2003 | Kozicki et al. | |
| 2003/0210564 A1 | 11/2003 | Kozicki et al. | |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.

Afifi, M.A.; Labib, H.H.; Fouad, S.S.; El-Shazly, A.A., Electrical & thermal conductivity of the amorphous semiconductor GexSe1-x, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A., Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara,Y; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.

Baranovskii, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouale, A.; Pradel, A.; Ribes, M., Ion dynamics in the argyrodite compound Ag7GeSe5l: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73, (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.: Fousenan't, E.; El Bouchairi, B.; Goureaux, G., Polarized memory switching effects in Ag2Se/Se/M thin film sandwiches, Thin solid films 97 (1982) 165-171.

Bernede, J.C.; Khelil, A.; Kettaf, M.; Conan, A., Transition from S- to N-type differential negative resistance in Al-Al2O3-Ag2-xSe1+x thin film structures, Phys. Stat. Sol. (a) 7P (1982) 217-224.

Bondarev, V.N.; Pikhitsa, P.V., A dendrite model of current instability in RbAg4l5, Solid State Ionics 70/71 (1994) 72-76.

Boolchand, P., The maximum in glass transition temperature (Tg) near $x=\frac{1}{3}$ in GexSe1-x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalgocenide glasses, Properties and Applications of Amorphous Materials, M.F. Thorpe and Tichy, L. (eds) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P; Grothaus, J.; Bresser, W.J.; Suranyi, P., Structural origin of broken chemical order in a GeSe2 glass, Phys. Rev. B 25 (1982) 2975- 2978.

Boolchand, P.; Grothaus, J; Phillips, J.C., Broken chemical order and phase separation in GexSe1-x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati, (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) 17th (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique, 42 (1981) C4- 193-C4-196.

Bresser, W.J.; Boolchand, P.; Suranyi, P., Hernandez, J.G., Molecular phase separation and cluster size in GeSe2 glass, Hyperfine Interactions, 27 (1986) 389-392.

Cahen, D.; Gilet, J.-M.; Schmitz, C.; Chernyak, L; Gartsman, K.; Jakubowicz, A.; Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L., Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non ohmic conduction in some amorphous semiconductors, J. Non-Cryst. Solids 8-10 (1972) 782-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N., Klabunde, F., The hydrogenated amorphpus silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992) 259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44, (1993) 851-855.

Fadel, M.; El-Shair, H.T., Electrical, thermal and optical properties of Se75Ge7Sb18, Vacuum 43 (1992) 253-257.

Feng, X.; Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P.; Role of network connectivity on the elastic, plastic and thermal behavior of covalent glasses, J. Non-Cryst. Solids, 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1998) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non. Cryst. Solids 298 (2002) 260-269.

Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids, 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurments on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids, 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenine semiconductors, Vacuum 45 (1994) 459-462.

Hirose, Y.; Hirose, H.; Polarity-dependent memory switching and behavior of Ag dendrite in Ag-photodoped amorphous As2S3 films, J. Appl. Phys. 47 (1976) 2767-2772.

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Iizima, S.; Sugi, M.; Kikuchi, M.; Tanaka, K., Electrical and thermal properties of semiconducting glasses As-Te-Ge Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Korkinova, Ts.N.; Andreichin, R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V2O5 based glasses, Journal de Physique IV 2 (1992) C2-185-C2-188.

Messoussi, R.; Bernede, J.C.; Benhida, S.; Abachi, T; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozkicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topolgy on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinksy, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemial changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose, M.J.;Hajto,J.;Lecomber,P.G.;Gage,S.M.;Choi,W.K.;Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Snell, A.J.; Lecomber. P.G.; Hajto, J; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.; Rose, M.J.; Osborne, L.S.; Holmes, A.; Owen, A.E.; Gibson, R.A.C., Analogue memory effects in metal/a-Si:H/metal thin film structures, Mat. Res. Soc. Symp. Proc. V 297, 1993 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K., Iizima, S., Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal (??) (1972) 4609-4612.

Tichy. L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant, S.;Peytavin, S.;Ribes,M.;Flank,A.M.;Dexpert,H.;Lagarde,J.P., Silver chalcogenice glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y., Bernede, J.C., Silver movements in Ag2Te thin films: switching and memory effects, Thin Solid Films 57 (1979) 49-54.

Uemura, O.; Kameda, Y.; Kokai, S.; Satow, T.; Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S., Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2074.

West, W.C., Electrically erasable non-volatile memory via electrochemical deposition of multifractal aggregates, Ph.D. Dissertation, ASU 1998.

Zhang, M., Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151. (1992) 149-154.

\* cited by examiner

METHOD OF FORMING A RESISTANCE VARIABLE MEMORY ELEMENT

FIELD OF THE INVENTION

The invention relates to the field of random access memory (RAM) devices formed using a resistance variable material, and in particular to controlling silver incorporation into a resistance variable memory element formed using chalcogenide glass.

BACKGROUND OF THE INVENTION

A well known semiconductor memory component is random access memory (RAM). RAM permits repeated read and write operations on memory elements. Typically, RAM devices are volatile, in that stored data is lost once the power source is disconnected or removed. Non-limiting examples of RAM devices include dynamic random access memory (DRAM), synchronized dynamic random access memory (SDRAM) and static random access memory (SRAM). In addition, DRAMS and SDRAMS also typically store data in capacitors which require periodic refreshing to maintain the stored data.

Recently resistance variable memory elements have been investigated for suitability as semi-volatile and non-volatile random access memory elements. In a resistance variable memory element, a conductive material, such as silver, is incorporated into a dielectric material. The resistance of the conductive material containing dielectric material can be changed between high resistance and low resistance states. The resistance variable memory element is normally in a high resistance state when at rest. A write operation to a low resistance state is performed by applying a voltage potential across the two electrodes.

One preferred resistance variable material comprises a chalcogenide glass. A specific example is germanium-selenide ($Ge_xSe_{100-x}$) containing a silver (Ag) component. One method of providing silver to the germanium-selenide composition is to initially form a germanium-selenide glass and then deposit a thin layer of silver upon the glass, for example by sputtering, physical vapor deposition, or other known techniques in the art. The layer of silver is irradiated, preferably with electromagnetic energy at a wavelength less than 600 nanometers, so that the energy passes through the silver and to the silver/glass interface, to break a chalcogenide bond of the chalcogenide material such that the glass is doped or photodoped with silver. Another method for providing silver to the glass is to provide a layer of silver-selenide on a germanium-selenide glass. A top electrode comprising silver is then formed over the silver-germanium-selenide glass or in the case where a silver-selenide layer is provided over a germanium-selenide glass, the top electrode is formed over the silver-selenide layer.

It has been found that over time devices fabricated via the above described methods fail if excess silver from a top silver containing electrode continues to diffuse into the silver germanium-selenide glass or into the silver-selenide layer and eventually into the germanium-selenide glass layer (the primary switching area) below the silver-selenide layer.

Furthermore, during semiconductor processing and/or packaging of a fabricated structure that incorporates the memory element, the element undergoes thermal cycling or heat processing. Heat processing can result in substantial amounts of silver migrating into the memory element uncontrollably. Too much silver incorporated into the memory element may result in faster degradation, i.e., a short life, and eventually device failure.

Control of the amount of available silver which enters the glass would be highly desirable to prevent premature memory cell failure.

BRIEF SUMMARY OF THE INVENTION

The present invention is a method of controlling silver doping of a chalcogenide glass in a resistance variable memory element. The method includes forming a first chalcogenide glass layer; forming a first silver-selenide layer in contact with the first chalcogenide glass layer; forming a second chalcogenide glass layer in contact with the first silver-selenide layer; forming a silver layer in contact with the second chalcogenide glass layer; processing the silver layer and second chalcogenide glass layer to incorporate silver into the second chalcogenide glass layer, thereby forming one or more silver containing layers; and removing any remaining portions of the silver layer. Electrodes are provided in contact with the first chalcogenide layer and the one or more silver containing layers. Forming a resistance variable memory element in accordance with the invention limits the amount of silver available for diffusion into the first glass layer.

The silver layer and second chalcogenide glass layer may be processed by heat treating, light irradiation or a combination of both heat treating and light irradiation. Heat treating the silver layer will cause silver to be incorporated into the second chalcogenide glass interstitially. Processing the second chalcogenide glass layer with light irradiation will cause the formation of a silver doped chalcogenide glass layer having silver-selenide formed therein. Combining a heat treating process with light irradiation will result in silver-selenide formed in a chalcogenide glass layer having silver interstitially formed in the chalcogenide glass layer.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a plastic or a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species which have a slight excess or deficit of silver, for instance, $Ag_2Se$, $Ag_{2+x}Se$, and $Ag_{2-x}Se$.

The term "chalcogenide glass" is intended to include glasses that comprise an element from group VIA (or group 16) of the periodic table. Group VIA elements, also referred to as chalcogens, include sulfur (S), selenium (Se), tellurium (Te), polonium (Po), and oxygen (O).

Figure 1:
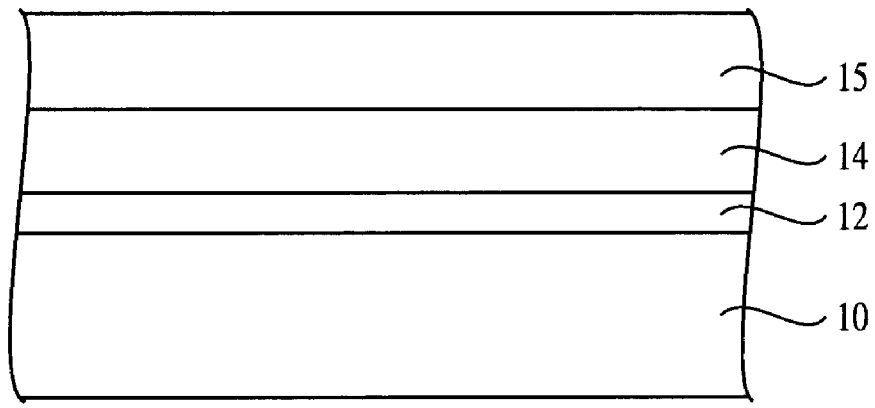
FIG. 1 illustrates a cross-sectional view of a memory element fabricated in accordance with a first embodiment of the invention and at an initial stage of processing.

The invention will now be explained with reference to FIGS. 1–10, which illustrate exemplary embodiments of a resistance variable memory element 100 fabricated in accordance with the invention. FIG. 1 depicts a portion of an insulating layer 12 formed over a semiconductor substrate 10, for example, a silicon substrate. It should be understood that the resistance variable memory element can be formed on a variety of substrate materials and not just semiconductor substrates such as silicon. For example, the insulating layer 12 may be formed on a plastic substrate. The insulating layer 12 may be formed by any known deposition methods, such as sputtering by chemical vapor deposition (CVD), plasma enhanced CVD (PECVD) or physical vapor deposition (PVD). The insulating layer 12 may be formed of a conventional insulating oxide, such as silicon oxide ($SiO_2$), a silicon nitride ($Si_3N_4$), or a low dielectric constant material, among many others.

A first electrode 14 is next formed over the insulating layer 12, as also illustrated in FIG. 1. The first electrode 14 may comprise any conductive material, for example, tungsten, nickel, tantalum, aluminum, or platinum, among many others. A first dielectric layer 15 is next formed over the first electrode 14. The first dielectric layer 15 may comprise the same or different materials as those described above with reference to the insulating layer 12.

Figure 2:
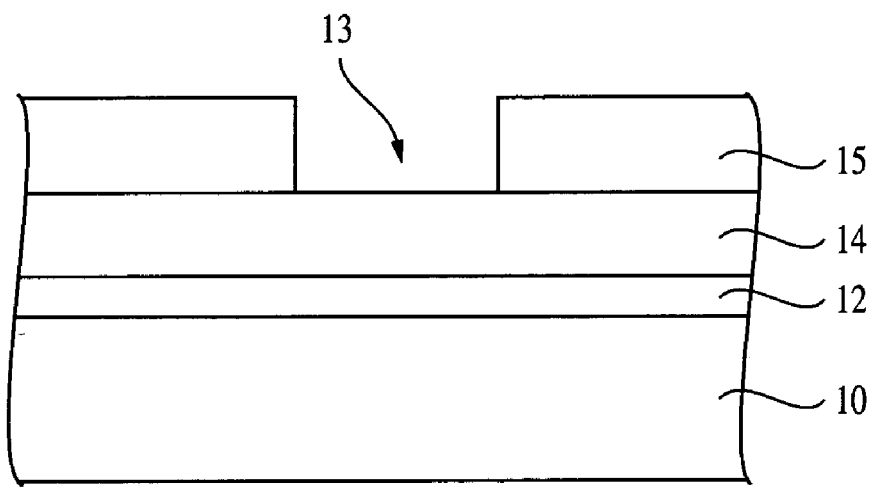
FIG. 2 illustrates a cross-sectional view of the memory element of FIG. 1 at a stage of processing subsequent to that shown in FIG. 1.
Figure 3:
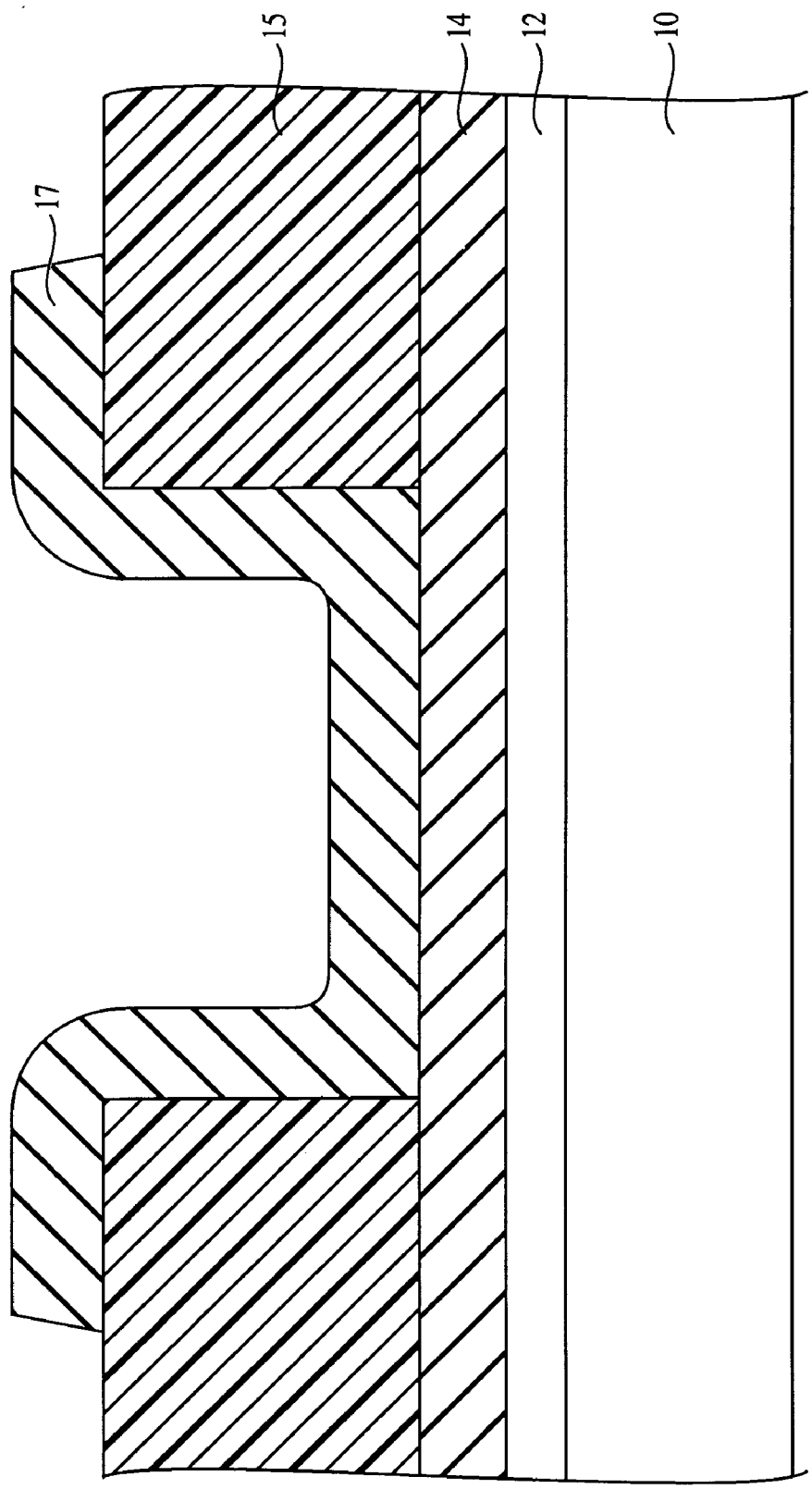
FIG. 3 illustrates a cross-sectional view of the memory element of FIG. 1 at a stage of processing subsequent to that shown in FIG. 2.

Referring now to FIG. 2, an opening 13 extending to the first electrode 14 is formed in the first dielectric layer 15. The opening 13 may be formed by known methods in the art, for example, by a conventional patterning and etching process. A first chalcogenide glass layer 17 is next formed over the first dielectric layer 15, to fill in the opening 13, as shown in FIG. 3.

The first chalcogenide glass layer 17 is preferably a germanium-selenide glass having a $Ge_xSe_{100-x}$ stoichiometry. The preferred stoichiometric range is between about $Ge_{18}Se_{82}$ to about $Ge_{43}Se_{57}$ and is more preferably about $Ge_{40}Se_{60}$. The first chalcogenide glass layer 17 preferably has a thickness from about 100 Å to about 1000 Å and is more preferably between about 150 Å to about 200 Å.

The use of a metal containing layer, such as a silver-selenide layer, in contact with the chalcogenide glass layer makes it unnecessary to provide a metal (silver) doped chalcogenide glass, which would require photodoping of the substrate with light radiation.

The formation of the first chalcogenide glass layer 17, having a stoichiometric composition in accordance with the invention may be accomplished by any suitable method. For instance, evaporation, co-sputtering germanium and selenium in the appropriate ratios, sputtering using a germanium-selenide target having the desired stoichiometry, or chemical vapor deposition with stoichiometric amounts of $GeH_4$ and $SeH_2$ gases (or various compositions of these gases), which result in a germanium-selenide film of the desired stoichiometry are examples of methods which may be used to form the first chalcogenide glass layer 17.

Figure 4:
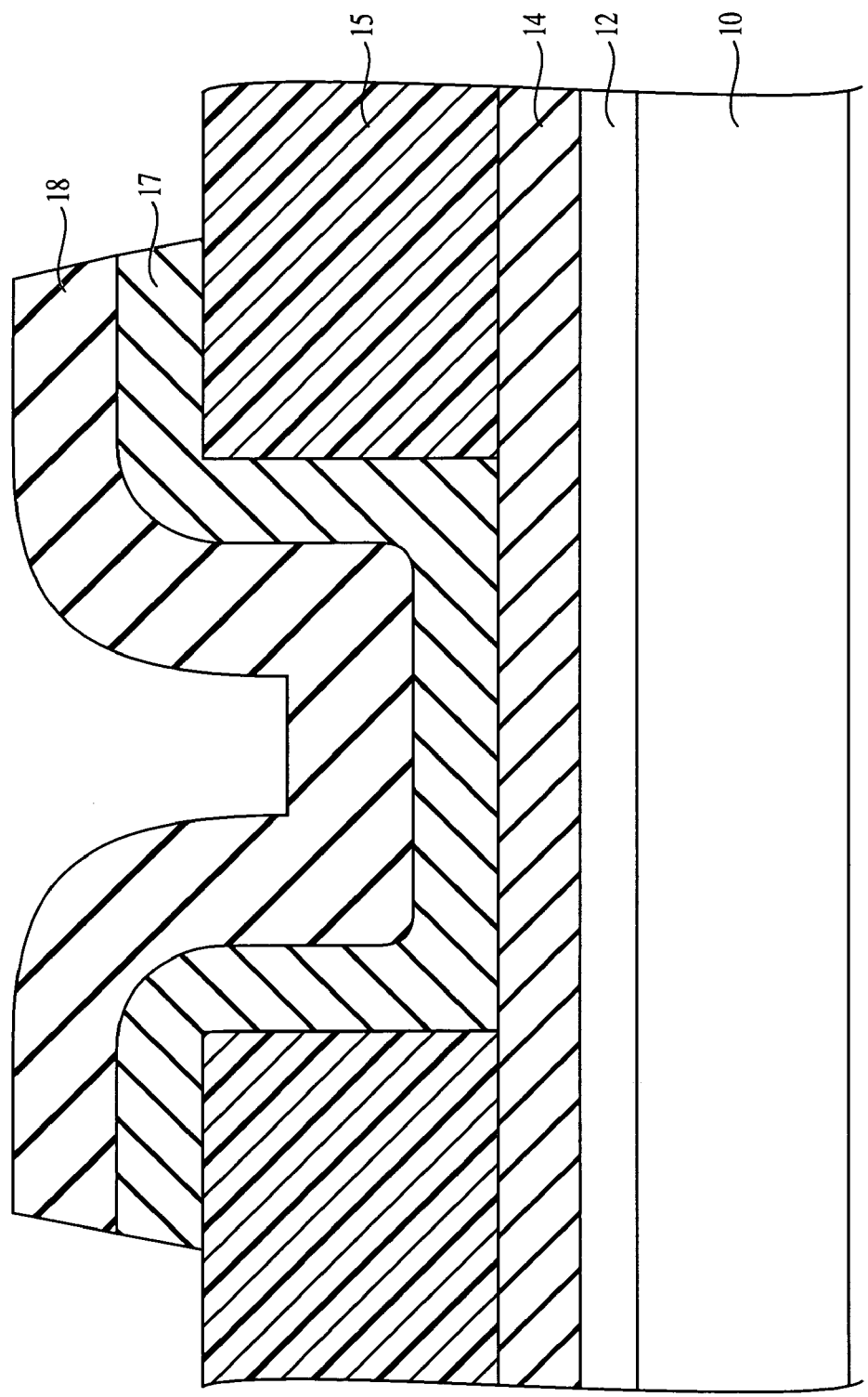
FIG. 4 illustrates a cross-sectional view of the memory element of FIG. 1 at a stage of processing subsequent to that shown in FIG. 3.

Referring now to FIG. 4, a first metal containing layer 18, preferably silver-selenide, is deposited over the first chalcogenide glass layer 17. Other suitable metal containing layers 18 may include silver-chalcogenide layers, for example, silver sulfide, silver oxide, and silver telluride. A variety of processes can be used to form the metal containing layer 18. For instance, physical vapor deposition techniques such as evaporative deposition and sputtering may be used. Other processes such as chemical vapor deposition, co-evaporation or depositing a layer of selenium above a layer of silver to form silver-selenide can also be used.

The layers may be any suitable thickness and depends upon the desired electrical switching characteristics. The thickness of the layers is such that the metal containing layer 18 is thicker than the first chalcogenide glass layer 17. The metal containing layer 18 is also thicker than a second glass layer, described below. The first metal containing layer 18 preferably has a thickness from about 300 Å to about 600 Å.

Figure 5:
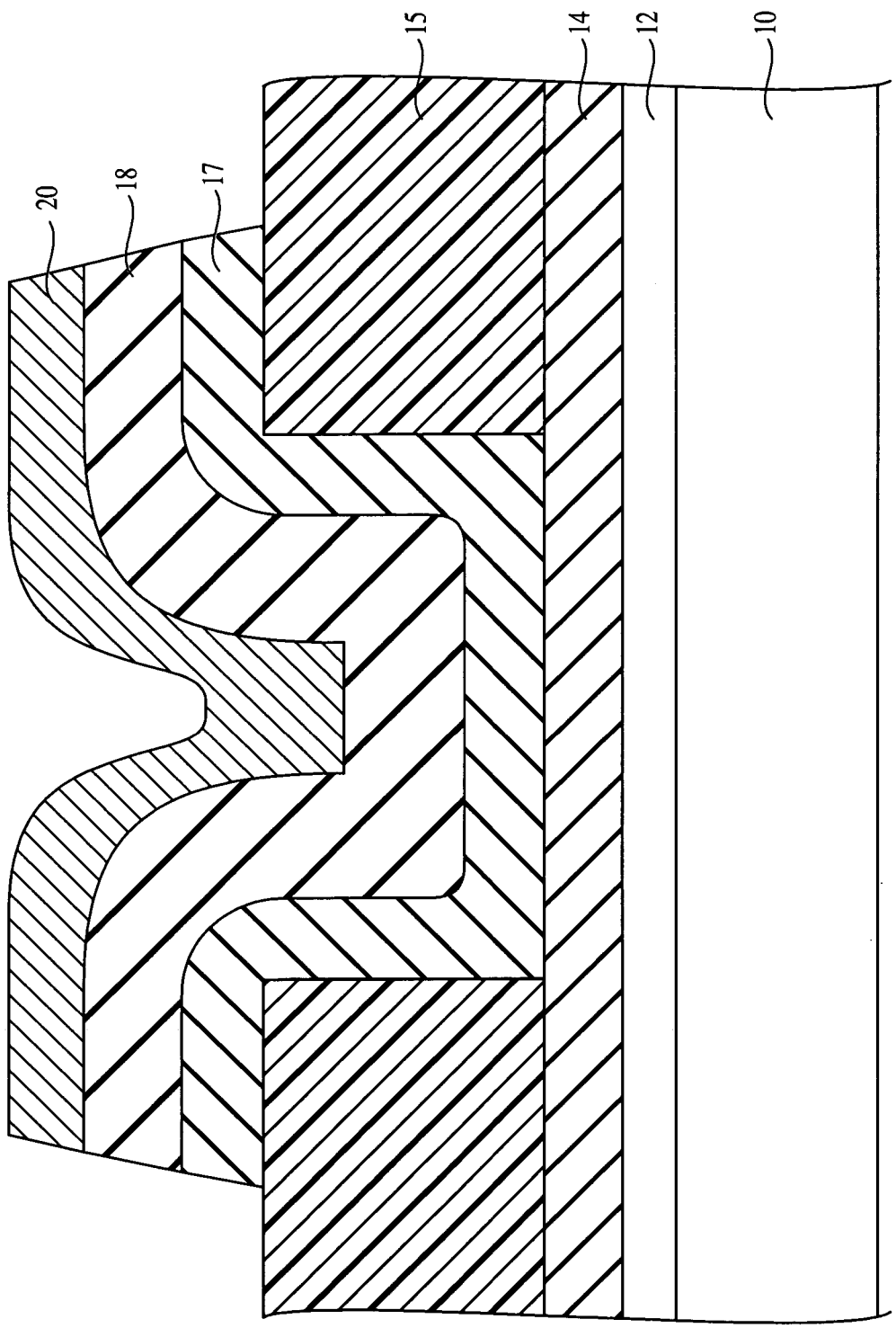
FIG. 5 illustrates a cross-sectional view of the memory element of FIG. 1 at a stage of processing subsequent to that shown in FIG. 4.

Referring now to FIG. 5 a second chalcogenide glass layer 20 is formed over the first metal containing layer 18. The second chalcogenide glass layer 20 allows deposition of silver above the metal containing layer 18, for example, a silver-selenide layer, since silver cannot be directly deposited on silver-selenide.

The second chalcogenide glass layer 20 is preferably a germanium-selenide glass having a $Ge_xSe_{100-x}$ stoichiometry. The preferred stoichiometric range of the second glass layer depends on the type of processing the layer will undergo, i.e., thermal, light irradiation or a combination of thermal and light irradiation. The second chalcogenide glass layer 20 preferably has a thickness between about 150 Å to about 500 Å and is more preferably 200 Å.

The formation of the second chalcogenide glass layer 20 may be accomplished by any suitable method. For instance, chemical vapor deposition, evaporation, co-sputtering, or sputtering using a target having the desired stoichiometry, may be used.

Figure 6:
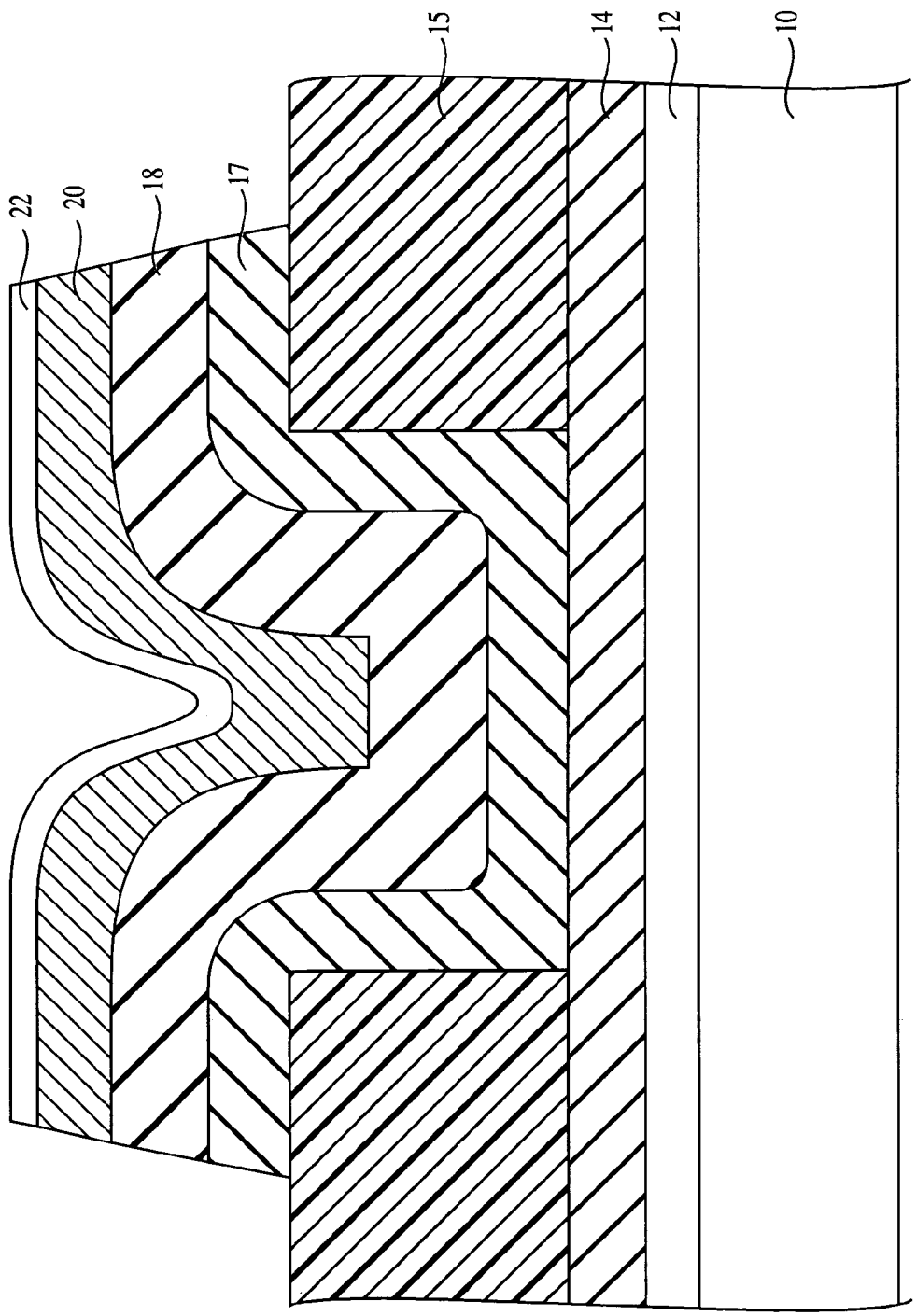
FIG. 6 illustrates a cross-sectional view of the memory element of FIG. 1 at a stage of processing subsequent to that shown in FIG. 5.

Referring now to FIG. 6, a silver layer 22 is formed over the second chalcogenide glass layer 20. The silver layer is preferably between about 150 Å and about 300 Å thick. The silver layer may be deposited by any suitable mechanism, for instance, physical vapor deposition (PVD) or evaporation. Next the silver layer 22 is thermally treated, irradiated with light, or thermally treated in combination with the irradiation treatment to cause sufficient diffusion of silver into the second chalcogenide glass layer 20.

Figure 7:
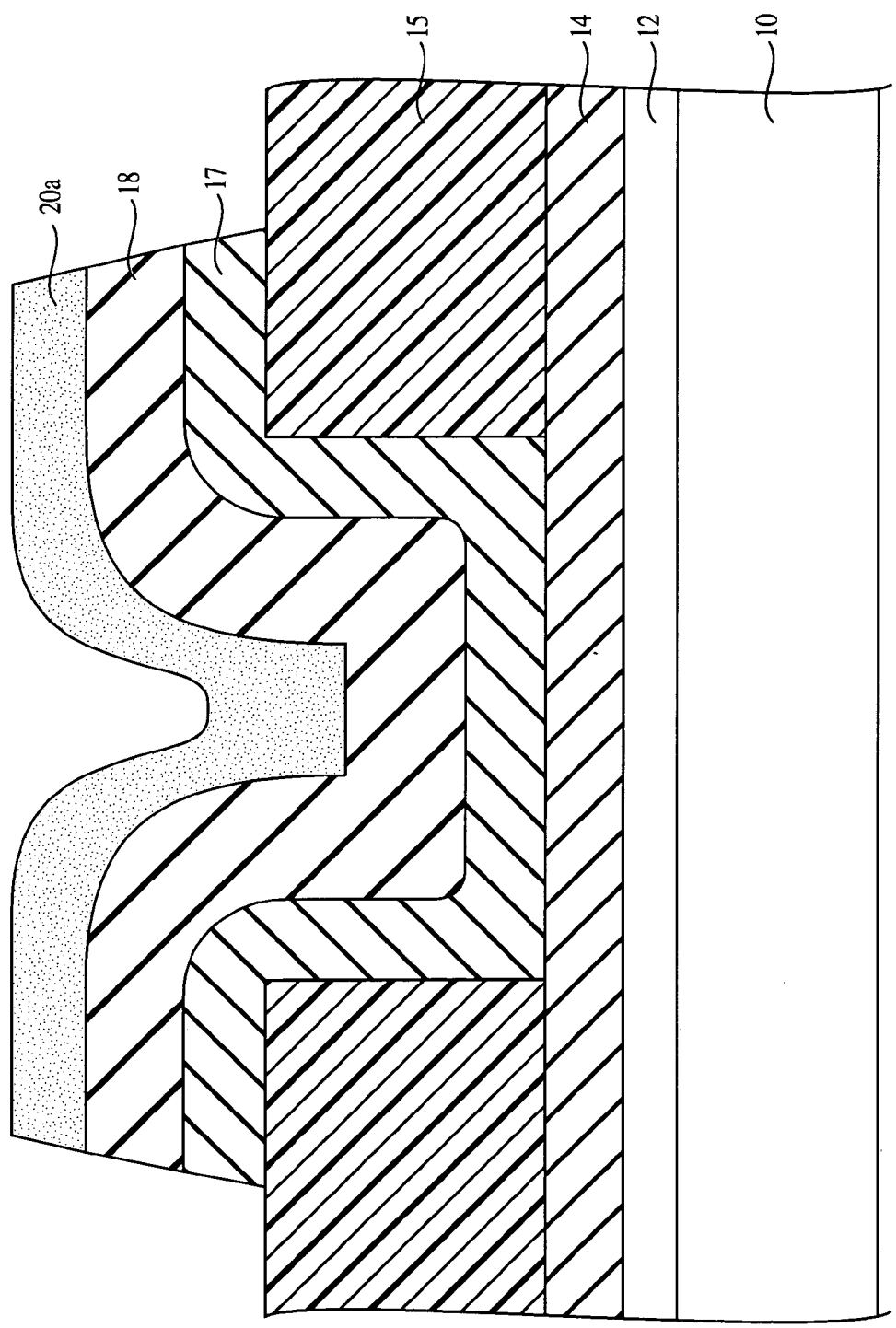
FIG. 7 illustrates a cross-sectional view of the memory element of FIG. 1 at a stage of processing subsequent to that shown in FIG. 6 in accordance with a first embodiment of the inventor.

Referring now to FIG. 7, the silver layer 22 and the second chalcogenide glass layer 20 are thermally treated, preferably by heat annealing in order to form a silver-containing chalcogenide glass layer 20a wherein silver is incorporated interstitially. The preferred stoichiometric range of the second chalcogenide glass layer 20 for thermal processing is between about $Ge_{18}Se_{82}$ to about $Ge_{43}Se_{57}$ and is more preferably about $Ge_{40}Se_{60}$. A suitable annealing temperature is an elevated temperature close to or slightly below the thin film glass transition temperature of the second chalcogenide glass layer 20. The annealing temperature may be as low as 50° C. and as high as about 350° C. The preferred annealing temperature depends on the chosen glass stoichiometry. The substrate is preferably annealed for about 5 to about 15 minutes and more preferably about 10 minutes. The annealing preferably takes place in an atmosphere containing oxygen. A wet etch in nitric acid is then performed to remove any remaining portion of silver layer 22.

Figure 8A:
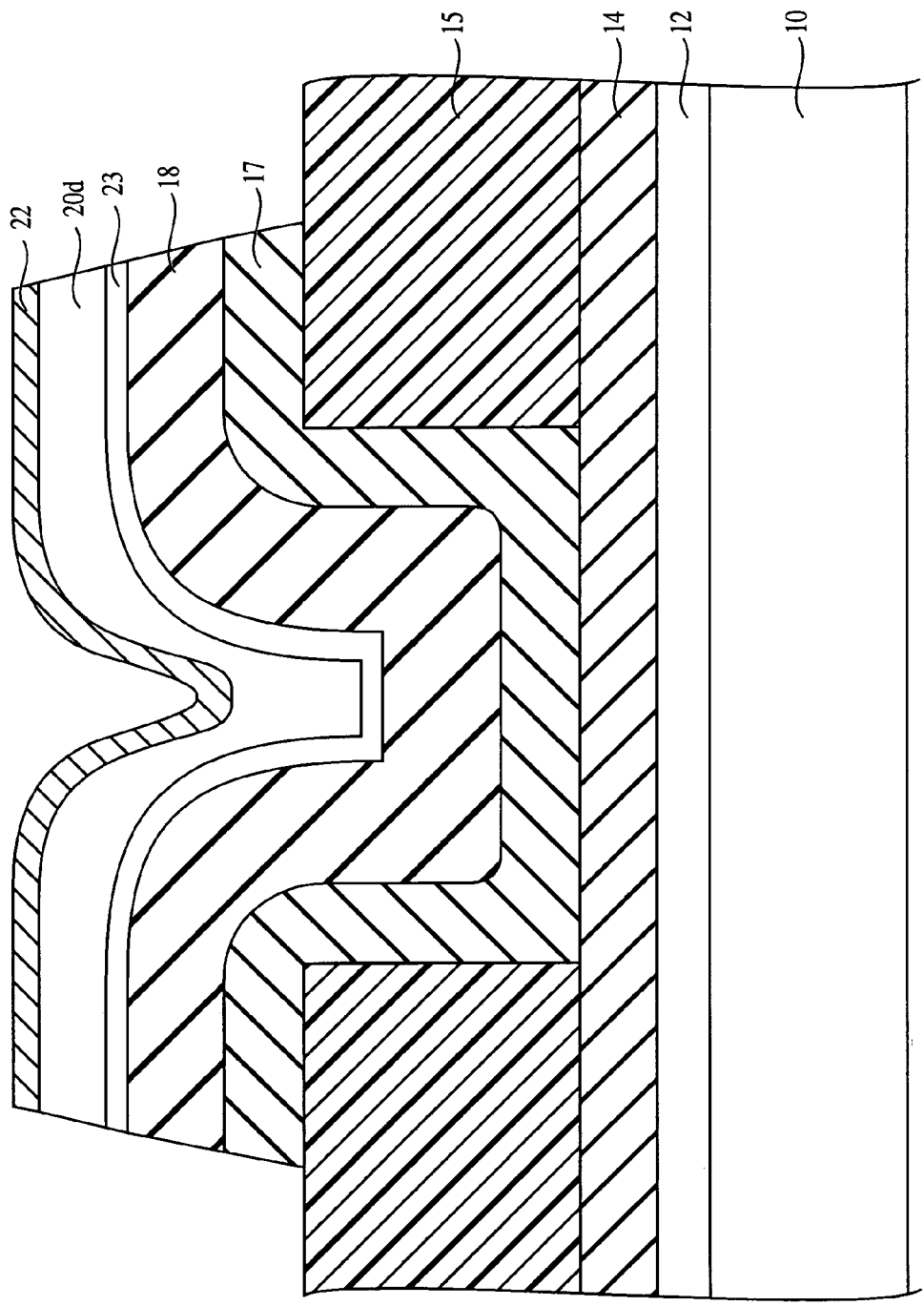
FIG. 8A illustrates a cross-sectional view of the memory element of FIG. 1 at a stage of processing subsequent to that shown in FIG. 6 in accordance with a second embodiment of the inventor.
Figure 8B:
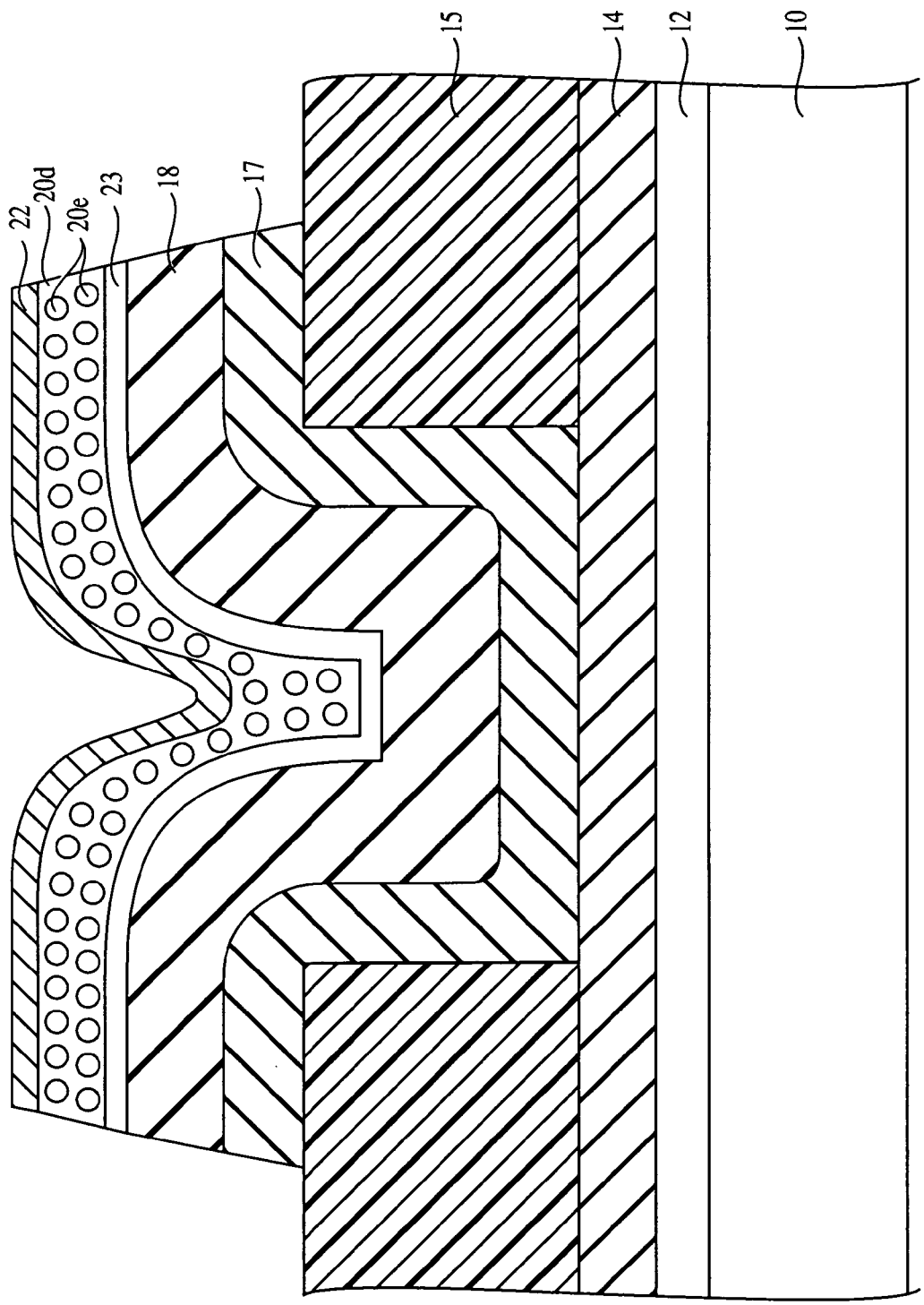
FIG. 8B illustrates a cross-sectional view of the memory element of FIG. 1 at a stage of processing subsequent to that shown in FIG. 8A in accordance with a second embodiment of the inventor.
Figure 8C:
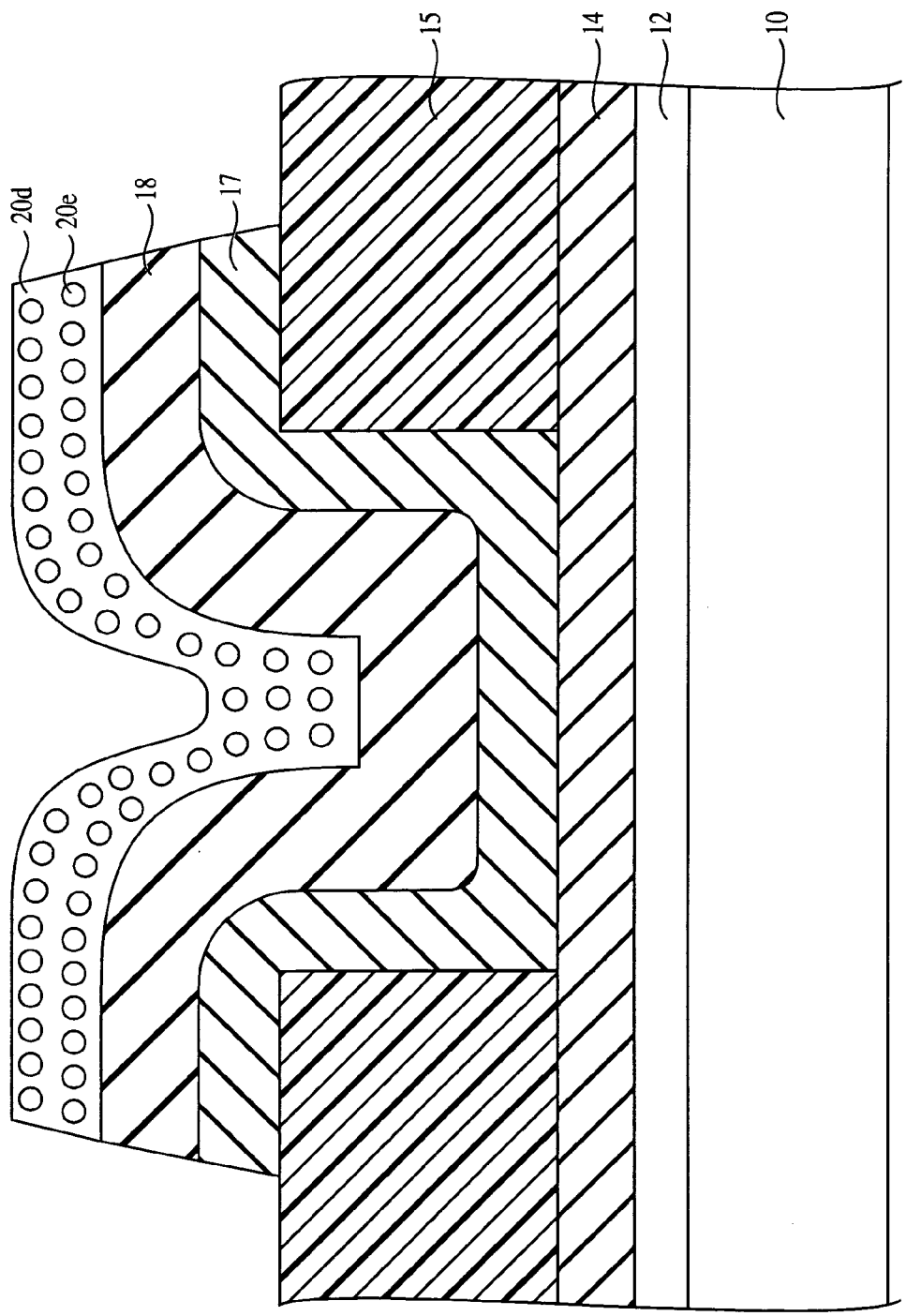
FIG. 8C illustrates a cross-sectional view of the memory element of FIG. 1 at a state of processing subsequent to that shown in FIG. 8B in accordance with a second embodiment of the inventor.

Referring now to FIGS. 8A–8C, alternatively silver from the silver layer 22 may be incorporated into the second chalcogenide glass layer 20 via irradiation with light. The silver layer 22 is irradiated with light to cause diffusion of silver ions from silver layer 22 into the second chalcogenide glass layer 20 thereby forming a silver doped chalcogenide glass layer 20d. For example, when the second chalcogenide glass layer includes germanium-selenide, irradiation further causes the formation of regions of silver-selenide 20e in the silver doped chalcogenide glass layer 20d. Research in this area is reported in the article "Dual Chemical Role of Ag as an Additive in Chalcogenide Glasses" by Mitcova et al., Physical Review Letters, Vol. 83, No. 19 (1999), pgs. 3848–3851, the disclosure of which is incorporated herein by reference.

The preferred stoichiometric range for light irradiation processing is between about $Ge_{18}Se_{82}$ to about $Ge_{33}Se_{67}$ and is more preferably about $Ge_{25}Se_{75}$. Preferably, about 1% to about 10% less than the maximum amount of silver necessary to keep the glass layer 20 in an amorphous state is diffused into the glass layer. Any residual glass 23 will preferably have a lower stoichiometry than the preprocessing second chalcogenide glass layer 20. Accordingly, a silver-doped germanium-selenide glass layer having regions of silver-selenide 20b incorporated therein, and a layer containing any remaining undoped glass 23 are formed. The silver layer 22 may be irradiated with any suitable light, for example, visible light or ultraviolet light. The silver layer 22 may be irradiated for about 5 to about 15 minutes at about 1 to about 10 mw/cm$^2$ with light between 200–600 nm. Any remaining silver layer is then removed, for example, via wet etching in nitric acid.

Not to be held to any particular theory, it is believed that as the silver layer 22 and second chalcogenide glass layer 20 are irradiated with light over time there is an initial doping of silver into the second chalcogenide glass layer 20 forming a structure having a silver doped chalcogenide glass layer 20d formed between the silver layer 22 and any remaining undoped second chalcogenide glass layer 23 as shown in FIG. 8A. With further irradiation, regions of silver-chalcogenide, for example, silver-selenide, 20e are formed in the silver doped chalcogenide glass layer 20d as show in FIG. 8B. For purposes of simplified discussion, silver-chalcogenide 20e will be further described herein as silver-selenide. However, it should be understood that other silver-chalcogenides could also be used. Ideally with further irradiation, the silver layer 22 will be completely diffused into the silver doped chalcogenide glass layer 20d leaving no undoped remaining GeSe glass and forming a silver doped chalcogenide glass layer 20d having regions of silver-selenide 20e formed therein as shown in FIG. 8C.

Figure 9:
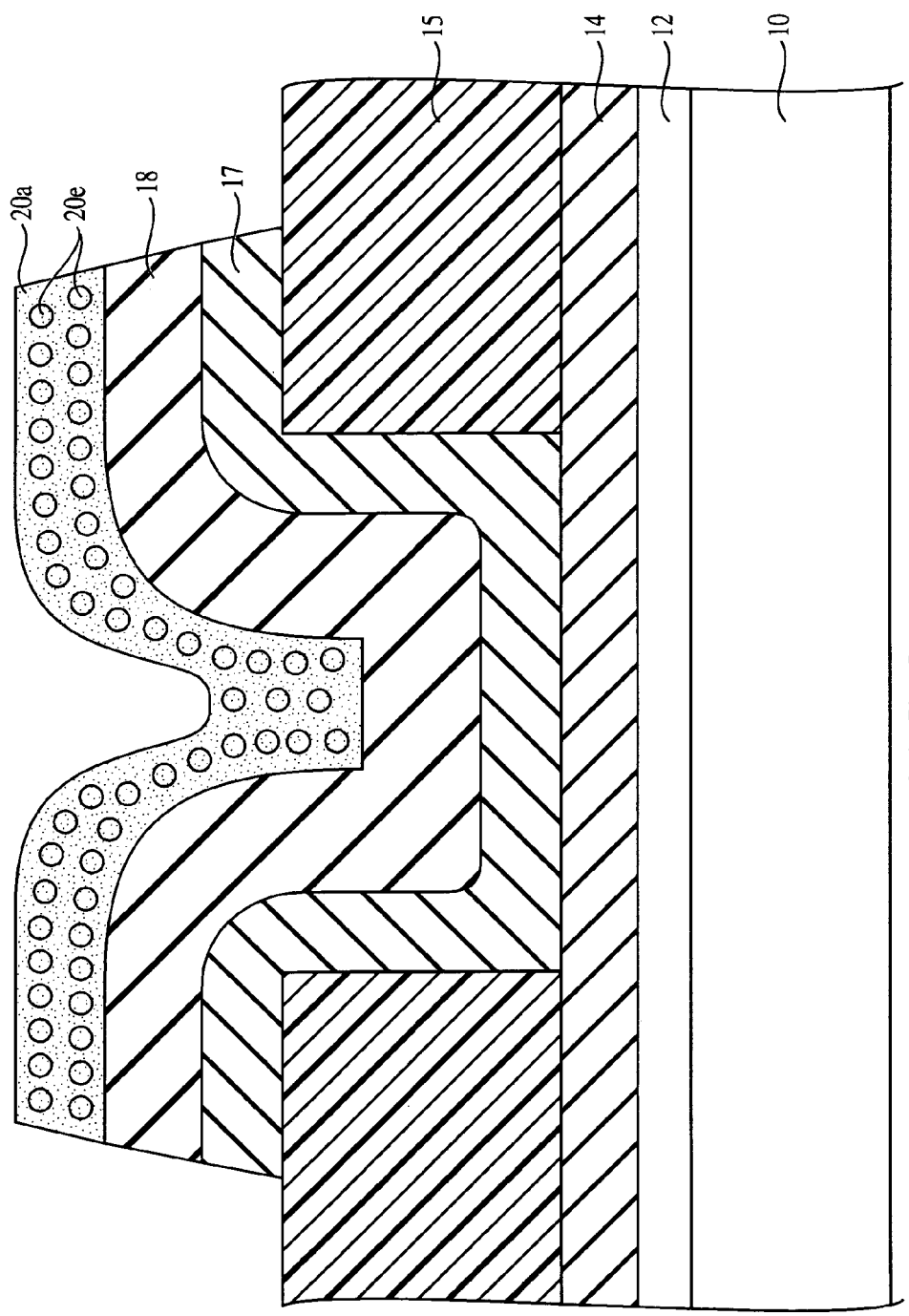
FIG. 9 illustrates a cross-sectional view of the memory element of FIG. 1 at a stage of processing subsequent to that shown in FIG. 6 in accordance with a third embodiment of the inventor.

Referring now to FIG. 9, alternatively silver from layer 22 may be incorporated into the glass layer 20 by light irradiation as described above in combination with the thermal treatment described above. Preferably thermal treating would be done first to saturate a portion of the glass layer 20 with silver to form a silver containing germanium-selenide glass layer 20a wherein silver is incorporated interstitially. Then the substrate would be irradiated to form regions of silver-selenide 20e within the glass layer having silver incorporated interstitially therein 20a. However, although it is preferred that the silver be driven into the glass by thermal processing first then light irradiation, it is to be understood that the process may be reversed, in that silver may be driven into the glass by light irradiation first then thermal processing can be applied. Alternatively, light irradiation and thermal processing may be performed simultaneously. Combining a light irradiation process with a thermal process to process silver into the glass layer provides an interstitially formed silver containing glass layer 20a having silver-selenide regions 20e formed therein. Any remaining silver from layer 22 is then removed, for example, using wet etching in nitric acid. The preferred stoichiometric range for a combination of light irradiation and thermal processing is between about $Ge_{18}Se_{82}$ to about $Ge_{33}Se_{67}$ and is more preferably about $Ge_2Se_{75}$.

Figure 10:
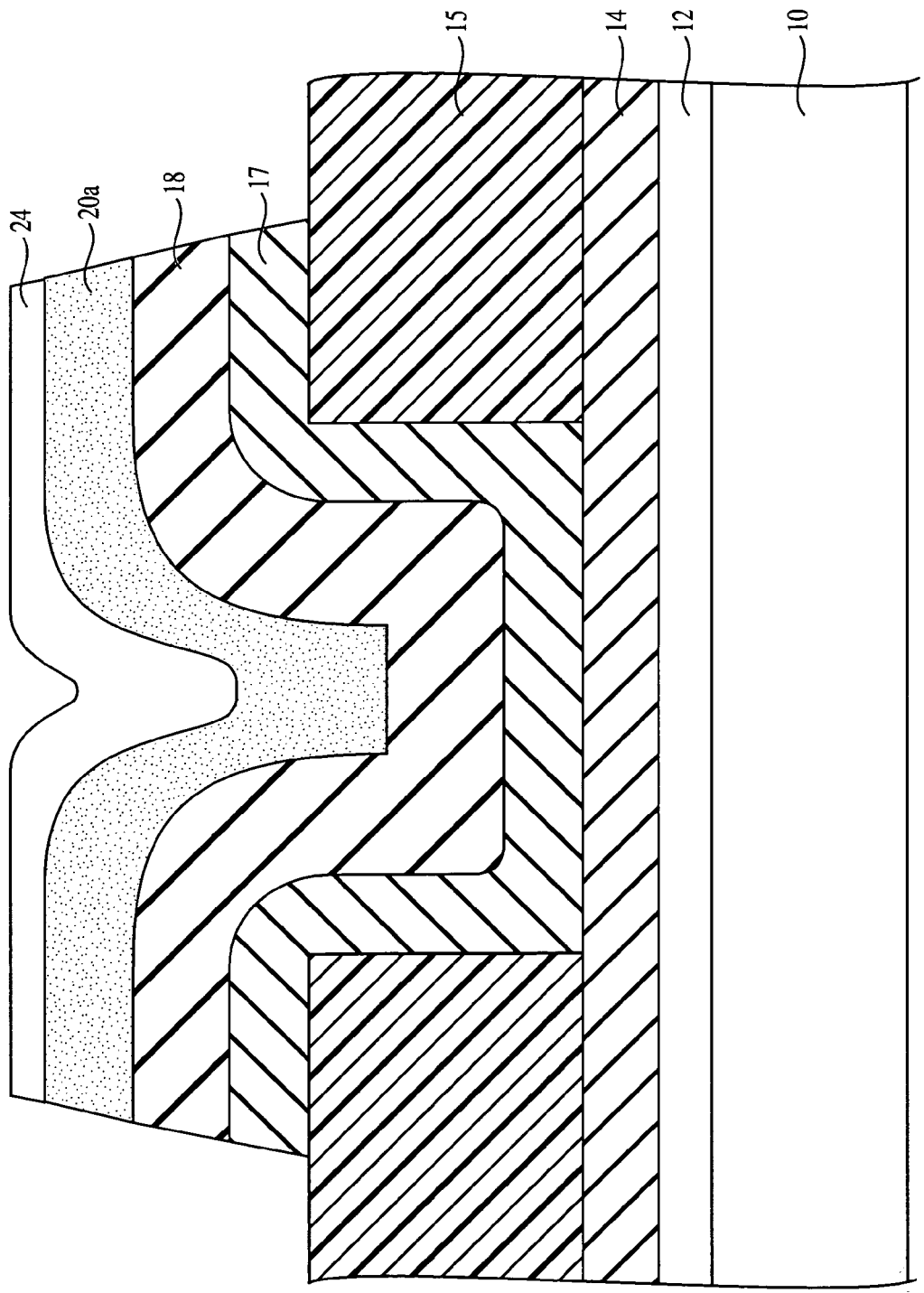
FIG. 10 illustrates a cross-sectional view of the memory element of FIG. 1 at a stage of processing subsequent to that shown in FIG. 7.

Referring now to FIG. 10, a second conductive electrode material 24 is formed over the resulting silver containing chalcogenide glass layer 20a (FIG. 7) or 20d/20e (FIG. 8C) or 20a/20e (FIG. 9). For example, if a thermal treatment is used, the second conductive electrode 24 is formed over the resulting interstially formed silver containing chalcogenide glass layer 20a, if light irradiation is used, the second conductive electrode 24 is formed over the silver doped chalcogenide glass layer 20d having silver-selenide regions 20e formed therein, or if a combination of thermal treatment and light irradiation is used, the second conductive electrode 24 is formed over the resulting interstitially formed silver containing glass layer 20a having silver-selenide regions 20e formed therein. The second conductive electrode material 22 may comprise any electrically conductive material, for example, tungsten, tantalum or titanium, among many others, but does not contain silver.

Figure 11:
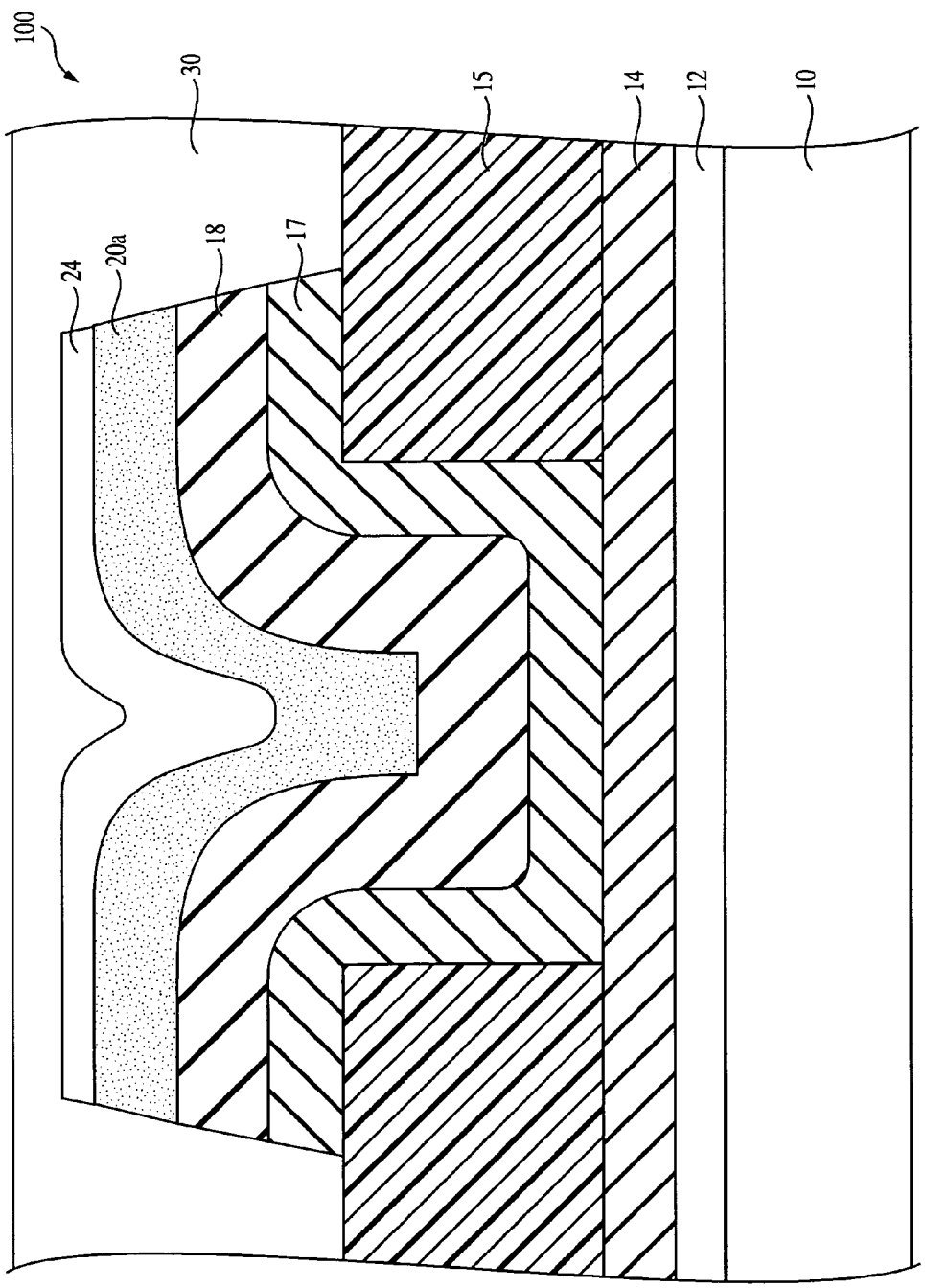
FIG. 11 illustrates a cross-sectional view of the memory element of FIG. 1 at a stage of processing subsequent to that shown in FIG. 10.

Referring now to FIG. 11, one or more additional dielectric layers 30 may be formed over the second electrode 24 and the first dielectric layer 15 to isolate the resistance variable memory element 100 from other structure fabrication over the substrate 10. Conventional processing steps can then be carried out to electrically couple the first and second electrodes 14, 24 to various circuits of memory arrays.

Devices fabricated in accordance with the invention, limit the amount of silver available to migrate into the first chalcogenide glass layer 17 by removing any remaining silver layer 22 and by using a second electrode that does not contain silver.

Figure 12:
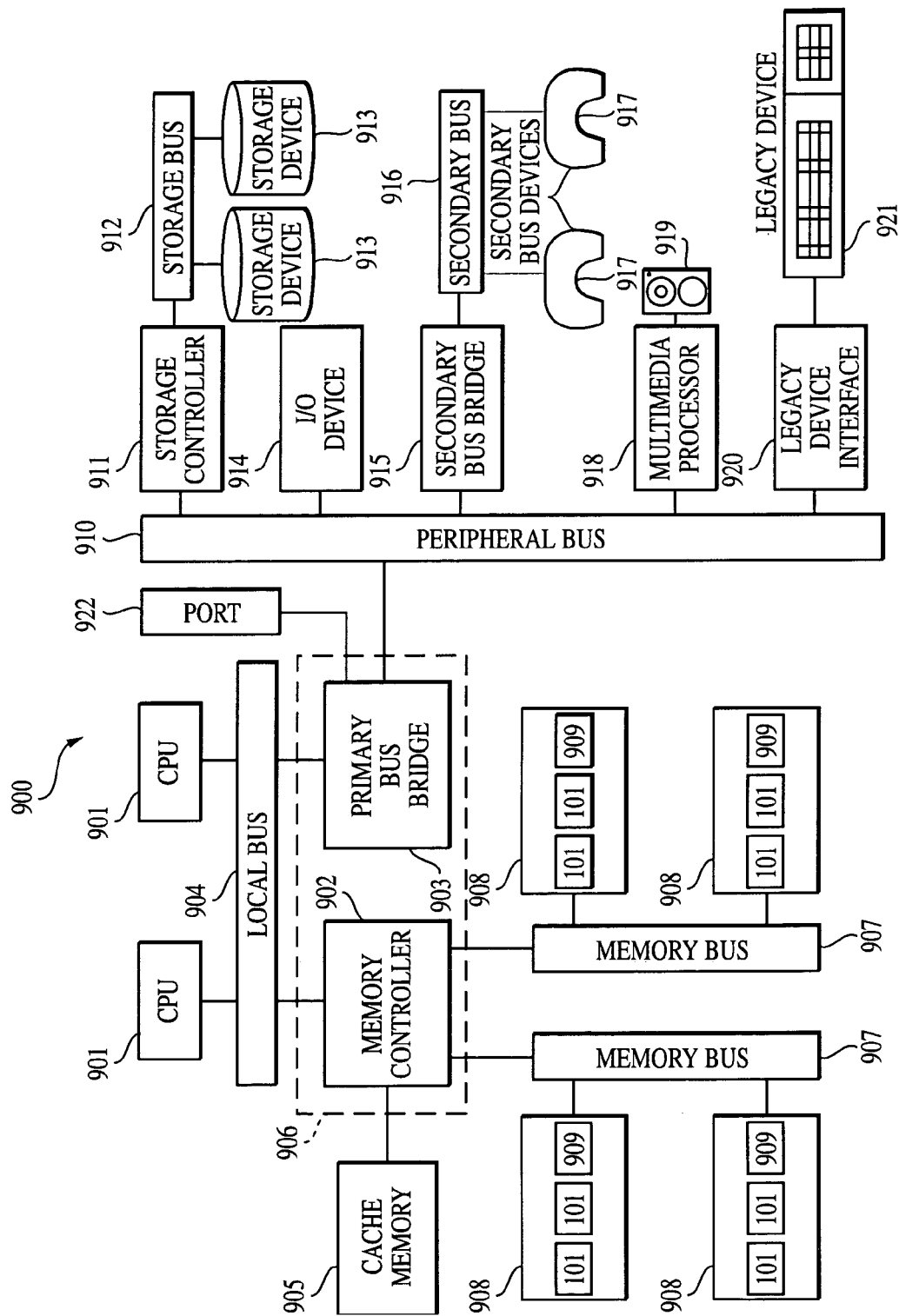
FIG. 12 illustrates a processor-based system having a memory element formed according to the invention.

The resistance variable memory element 100 of the invention may be used in a random access memory device. FIG. 12 illustrates an exemplary processing system 900 which utilizes a resistance variable memory random access device 101 containing an array of resistance variable memory elements constructed as described above with reference to FIGS. 1–11. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908, which include at least one memory device 101 of the invention. Alternatively, in a simplified system, the memory controller 902 may be omitted and the memory components directly coupled to one or more processors 901. The memory components 908 may be a memory card or a memory module. The memory components 908 may include one or more additional devices 909. For example, the additional device 909 might be a configuration memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 12 is only an exemplary processing system with which the invention may be used. While FIG. 12 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory elements 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The invention is not limited to the details of the illustrated embodiment. Accordingly, the above description and drawings are only to be considered illustrative of exemplary embodiments which achieve the features and advantages of the invention. Modifications and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming a resistance variable memory element comprising the acts of:
    forming a first chalcogenide glass layer;
    forming a first metal containing layer over said first chalcogenide glass layer;
    forming a second chalcogenide glass layer over said first metal containing layer;
    forming a second metal containing layer over said second chalcogenide glass layer;
    processing said second metal containing layer and said second chalcogenide glass layer to incorporate metal from said second metal containing layer into said second chalcogenide glass layer to form a metal containing chalcogenide glass layer; and
    removing all remaining portions of said second metal containing layer.

2. The method of claim 1 wherein said second metal containing layer comprises a silver layer.

3. The method of claim 1 wherein said first chalcogenide glass layer comprises a material having the formula $Ge_xSe_{100-x}$, wherein x is between about 18 to about 43.

4. The method of claim 3 wherein said first chalcogenide glass layer has a stoichiometry of about $Ge_{40}Se_{60}$.

5. The method of claim 1 wherein said first metal containing layer comprises silver-selenide.

6. The method of claim 1 wherein said first chalcogenide glass layer has a thickness of from about 100 Å to about 400 Å.

7. The method of claim 1 wherein said first metal containing layer has a thickness of from about 300 Å to about 600 Å.

8. The method of claim 1 wherein said second chalcogenide glass layer has a thickness of from about 150 Å to about 500 Å.

9. The method of claim 1 wherein said step of processing said second metal containing layer and said second chalcogenide glass layer comprises irradiating said second metal containing layer with light.

10. The method of claim 9 wherein said second chalcogenide glass layer comprises a material having the formula $Ge_xSe_{100-x}$, wherein x is between about 18 to about 33.

11. The method of claim 10 wherein said second chalcogenide glass layer has a stoichiometry of about $Ge_{25}Se_{75}$.

12. The method of claim 9 wherein said light is visible light.

13. The method of claim 12 wherein said metal containing chalcogenide glass layer comprises silver-selenide.

14. The method of claim 9 wherein said light is ultraviolet.

15. The method of claim 9 wherein said metal containing chalcogenide glass layer comprises a metal doped chalcogenide glass layer having metal chalcogenide formed therein.

16. A method of forming a resistance variable memory element comprising the acts of:
forming a first chalcogenide glass layer;
forming a first metal containing layer over said first chalcogenide glass layer;
forming a second chalcogenide glass layer over said first metal containing layer;
forming a second metal containing layer over said second chalcogenide glass layer;
processing said second metal containing layer and said second chalcogenide glass layer to incorporate metal from said second metal containing layer into said second chalcogenide glass layer to form a metal containing chalcogenide glass layer, wherein said step of processing said second metal containing layer and said second chalcogenide glass layer comprises heat treating said second metal containing layer and said second chalcogenide glass layer.

17. The method of claim 16 wherein said step of heat treating comprises annealing said second metal containing layer and said second chalcogenide glass layer at an elevated temperature equal to or slightly below a thin film glass transition temperature of the second chalcogenide glass layer.

18. The method of claim 16 wherein said metal containing chalcogenide glass layer comprises a chalcogenide glass layer having said metal incorporated interstitially therein.

19. The method of claim 16 wherein said second chalcogenide glass layer comprises a material having the formula $Ge_xSe_{100-x}$, wherein x is between about 18 to about 43.

20. The method of claim 19 wherein said second chalcogenide glass layer has a stoichiometry of about $Ge_{40}Se_{60}$.

21. A method of forming a resistance variable memory element comprising the acts of:
forming a first chalcogenide glass layer;
forming a first metal containing layer over said first chalcogenide glass layer;
forming a second chalcogenide glass layer over said first metal containing layer;
forming a second metal containing layer over said second chalcogenide glass layer;
processing said second metal containing layer and said second chalcogenide glass layer to incorporate metal from said second metal containing layer into said second chalcogenide glass layer to form a metal containing chalcogenide glass layer, wherein said step of processing said second metal containing layer and said second chalcogenide glass layer comprises heat treating said second metal containing layer and said second chalcogenide glass layer and irradiating said second metal containing layer and said second chalcogenide glass layer with light irradiation.

22. The method of claim 21 wherein said second chalcogenide glass layer is transformed into a metal-chalcogenide material formed in a chalcogenide glass layer having metal incorporated interstitially therein.

23. The method of claim 22 wherein said metal-chalcogenide comprises silver-selenide.

24. The method of claim 21 wherein said second chalcogenide glass layer comprises a material having the formula $Ge_xSe_{100-x}$, wherein X is between about 18 to about 33.

25. The method of claim 24 wherein said second chalcogenide glass layer has a stoichiometry of about $Ge_{25}Se_{75}$.

26. A method of forming a resistance variable memory element comprising the acts of:
forming a first electrode;
forming a first germanium-selenide glass layer overlying and in electrical communication with said first electrode;
forming a first silver-selenide layer overlying and in electrical communication with said first germanium-selenide glass layer;
forming a second germanium-selenide glass layer overlying and in electrical communication with said first silver-selenide layer;
forming a silver layer overlying and in electrical communication with said second germanium-selenide glass layer;
processing said silver layer and said second germanium-selenide glass to convert said second germanium-selenide glass layer into a silver containing germanium-selenide glass layer; and
forming a second electrode overlying and electrical communication with said silver containing germanium-selenide glass layer; and
removing all remaining portions of said silver layer after said processing.

27. The method of claim 26 wherein said second electrode is not formed of silver.

28. The method of claim 26 wherein said first germanium-selenide glass layer has a stoichiometry of between about $Ge_{18}Se_{82}$ to about $Ge_{43}Se_{57}$.

29. The method of claim 28 wherein said first germanium-selenide glass layer has a stoichiometry of about $Ge_{40}Se_{60}$.

30. The method of claim 29 wherein second germanium-selenide glass layer has a stoichiometry of about $Ge_{40}Se_{60}$.

31. The method of claim 26 wherein said first germanium-selenide glass layer has a thickness of from about 100 Å to about 400 Å.

32. The method of claim 31 wherein said first germanium-selenide glass layer has a thickness of from about 150 Å to about 200 Å.

33. The method of claim 26 wherein said first silver-selenide layer has a thickness of from about 300 Å to about 600 Å.

34. The method of claim 26 wherein said second germanium-selenide glass layer has a thickness of from about 150 Å to about 500 Å.

35. The method of claim 34 wherein said second germanium-selenide glass layer has a thickness about 200 Å.

36. The method of claim 26 wherein said act of processing said silver layer and said second germanium-selenide glass layer comprises irradiating said silver layer and said second germanium-selenide glass layer with light.

37. The method of claim 36 wherein said second germanium-selenide glass layer has a stoichiometry of between about $Ge_{18}Se_{82}$ to about $Ge_{33}Se_{67}$.

38. The method of claim 37 wherein said second germanium-selenide glass layer has a stoichiometry of about $Ge_{25}Se_{75}$.

39. The method of claim 36 wherein said silver containing layer is irradiated for about 5 to about 15 minutes.

40. The method of claim 36 wherein said silver containing germanium-selenide glass layer comprises a silver doped germanium-selenide layer having silver-selenide incorporated therein.

41. A method of forming a resistance variable memory element comprising the acts of:
    forming a first electrode;
    forming a first germanium-selenide glass layer overlying and in electrical communication with said first electrode;
    forming a first silver-selenide layer overlying and in electrical communication with said first germanium-selenide glass layer;
    forming a second germanium-selenide glass layer overlying and in electrical communication with said first silver-selenide layer;
    forming a silver layer overlying and in electrical communication with said second germanium-selenide glass layer;
    processing said silver layer and said second germanium-selenide glass to convert said second germanium-selenide glass layer into a silver containing germanium-selenide glass layer; and
    forming a second electrode overlying and electrical communication with said silver containing germanium-selenide glass layer; and
    removing any remaining portions of said silver layer after said processing, wherein said act of processing comprises the act of heat treating.

42. The method of claim 41 wherein said second germanium-selenide glass layer has a stoichiometry of between about $Ge_{18}Se_{82}$ to about $Ge_{43}Se_{57}$.

43. The method of claim 41 wherein said act of heat treating comprises annealing said silver layer and said second germanium-selenide glass layer at an elevated temperature equal to or slightly below a thin film transition temperature of said second germanium-selenide glass layer.

44. The method of claim 41 wherein said act of heat treating is performed for a duration of about 5 to about 15 minutes.

45. The method of claim 41 wherein said act of heat treating is performed in the presence of oxygen.

46. The method of claim 41 wherein said silver containing germanium-selenide glass layers comprises a germanium-selenide glass layer having silver incorporated interstitially therein.

47. A method of forming a resistance variable memory element comprising the acts of:
    forming a first electrode;
    forming a first germanium-selenide glass layer overlying and in electrical communication with said first electrode;
    forming a first silver-selenide layer overlying and in electrical communication with said first germanium-selenide glass layer;
    forming a second germanium-selenide glass layer overlying and in electrical communication with said first silver-selenide layer;
    forming a silver layer overlying and in electrical communication with said second germanium-selenide glass layer;
    processing said silver layer and said second germanium-selenide glass to convert said second germanium-selenide glass layer into a silver containing germanium-selenide glass layer; and
    forming a second electrode overlying and electrical communication with said silver containing germanium-selenide glass layer; and
    removing any remaining portions of said silver layer after said processing, wherein said act of processing said silver layer and said second germanium-selenide glass layer comprises heat treating said silver layer and said second germanium-selenide glass layer and irradiating said silver layer and said second germanium-selenide glass layer with light.

48. The method of claim 47 wherein said silver containing germanium-selenide glass layers comprises silver-selenide incorporated into a chalcogenide glass layer having silver formed interstitially therein.

49. The method of claim 47 wherein said second germanium-selenide glass layer has a stoichiometry of about $Ge_{l8}Se_{82}$ to about $Ge_{33}Se_{67}$.

50. The method of claim 49 wherein said second germanium-selenide glass layer has a stoichiometry of about $Ge_{25}Se_{75}$.

51. The method of claim 47 wherein said act of removing any of said remaining silver layer is performed with a wet etch in nitric acid.

* * * * *

UNITED STATES PATENT AND TRADEMARK OFFICE
CERTIFICATE OF CORRECTION

PATENT NO.         : 7,163,837 B2
APPLICATION NO. : 10/230189
DATED                : January 16, 2007
INVENTOR(S)       : John T. Moore et al.

It is certified that error appears in the above-identified patent and that said Letters Patent is hereby corrected as shown below:

In the Other Publications portion of the References Cited section, the following publications are added as follows:

--Axon Technologies Corporation, TECHNOLOGY DESCRIPTION: Programmable Metalization Cell(PMC), pp. 1-6 (Pre-May 2000).

Helbert et al., Intralevel hybrid resist process with submicron capability, SPIE Vol. 333 SUBMICRON LITHOGRAPHY, pp. 24-29 (1982).

Hilt, DISSERTATION: Materials characterization of Silver Chalcogenide Programmable Metalization Cells, Arizona State University, pp. Title page-114 (UMI Company, May 1999).

Hirose et al., High Speed Memory Behavior and Reliability of an Amorphous $As_2S_3$ Film Doped Ag, PHYS. STAT. SOL. (a) 61, pp. 87-90 (1980).

Holmquist et al., Reaction and Diffusion in Silver-Arsenic Chalcogenide Glass Systems, 62 J. AMER. CERAM. SOC., No. 3-4, pp. 183-188 (March-April 1979).

Huggett et al., Development of silver sensitized germanium selenide photoresist by reactive sputter etching in $SF_6$, 42 APPL. PHYS. LETT. No. 7, pp. 592-594 (April 1983).

Kawaguchi et al., Mechanism of photosurface deposition, 164-166 J. NON-CRYST. SOLIDS, pp. 1231-1234 (1993).

Kolobov and Elliot, Photodoping of Amorphous Chalcogenides by Metals, Advances in Physics, Vol. 40, No. 5, 625-684 (1991).

Kozicki et al., "Applications of Programmable Resistance Changes in Metal-doped Chalcogenides", Proceedings of the 1999 Symposium on Solid State Ionic Devices, Editors – E.D. Wechtsman et al., The Electrochemical Society, Inc., 1-12 (1999).

Kozicki et al., Nanoscale effects in devices based on chalcogenide solid solutions, Superlattices and Microstructures, 27, 485-488 (2000).

Kozicki et al., Nanoscale phase separation in Ag-Ge-Se glasses, Microelectronic Engineering, vol. 63/1-3, 155-159 (2002).

UNITED STATES PATENT AND TRADEMARK OFFICE
CERTIFICATE OF CORRECTION

PATENT NO. : 7,163,837 B2
APPLICATION NO. : 10/230189
DATED : January 16, 2007
INVENTOR(S) : John T. Moore et al.

It is certified that error appears in the above-identified patent and that said Letters Patent is hereby corrected as shown below:

In the Other Publications portion of the References Cited section, the following publications are added as follows: (cont'd)

M.N. Kozicki and M. Mitkova, Silver incorporation in thin films of selenium rich Ge-Se glasses, Proceedings of the XIX International Congress on Glass, Society for Glass Technology, 226-227 (2001).

McHardy et al., The dissolution of metals in amorphous chalcogenides and the effects of electron and ultraviolet radiation, 20 J. PHYS. C.: SOLID STATE PHYS., pp. 4055-4075 (1987).

Owen et al., Metal-Chalcogenide Photoresists for High Resolution Lithography and Sub-Micron Structures, NANOSTRUCTURE PHYSICS AND FABRICATION, pp. 447-451 (M. Reed ed. 1989).

Shimizu et al., The Photo-Erasable Memory Switching Effect of Ag Photo-Doped Chalcogenide Glasses, 46 B. CHEM. SOC. JAPAN, No. 12, pp. 3662-3365 (1973).--

The following errors are corrected:

Column 6, line 24, "show" should read --shown--;

Column 6, line 58, "$Ge_2Se_{75}$" should read --$Ge_{25}Se_{75}$--;

Column 7, lines 31-32, "coupled the" should read --coupled to the--;

Column 7, line 51, "include" should read --includes--;

Column 7, lines 62-63, "an miscellaneous" should read --a miscellaneous--;

Column 7, line 64, "an legacy" should read --a legacy--;

Column 7, line 65, "also coupled" should read --also be coupled--;

Column 8, line 8, "an local" should read --a local--;

Column 8, line 12, "an universal" should read --a universal--;

Column 8, line 13, "via to the" should read --via the--;

UNITED STATES PATENT AND TRADEMARK OFFICE
CERTIFICATE OF CORRECTION

PATENT NO.         : 7,163,837 B2
APPLICATION NO. : 10/230189
DATED                 : January 16, 2007
INVENTOR(S)       : John T. Moore et al.

It is certified that error appears in the above-identified patent and that said Letters Patent is hereby corrected as shown below:

Column 8, line 16, "to one additional" should read --to additional--; and

Column 8, line 34, "system" should read --systems--.

In the Claims, the following errors are corrected:

Claim 26, column 10, line 54, "and electrical" should read --and in electrical--;

Claim 41, column 11, line 50, "and electrical" should read --and in electrical--;

Claim 47, column 12, line 34, "and electrical" should read --and in electrical--; and Claim 49, column 12, line 50, "$Ge_{1s}Se_{82}$" should read --$Ge_{18}Se_{82}$--.

Signed and Sealed this

Tenth Day of April, 2007

JON W. DUDAS
*Director of the United States Patent and Trademark Office*